(12) United States Patent
Lin et al.

(10) Patent No.: US 10,868,108 B2
(45) Date of Patent: Dec. 15, 2020

(54) SEMICONDUCTOR DEVICE HAVING HIGH VOLTAGE LATERAL CAPACITOR AND MANUFACTURING METHOD THEREOF

(71) Applicant: Taiwan Semiconductor Manufacturing Co., Ltd., Hsin-Chu (TW)

(72) Inventors: Meng-Han Lin, Hsinchu (TW); Te-Hsin Chiu, Miaoli County (TW); Wei Cheng Wu, Zhubei (TW); Te-An Chen, Beitun (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/273,260

(22) Filed: Feb. 12, 2019

(65) Prior Publication Data

US 2020/0006466 A1     Jan. 2, 2020

Related U.S. Application Data

(60) Provisional application No. 62/690,430, filed on Jun. 27, 2018.

(51) Int. Cl.
*H01L 49/02* (2006.01)
*H01L 27/08* (2006.01)
(Continued)

(52) U.S. Cl.
CPC ...... *H01L 28/40* (2013.01); *H01L 21/823481* (2013.01); *H01L 27/0629* (2013.01); *H01L 27/0805* (2013.01); *H01L 27/0811* (2013.01)

(58) Field of Classification Search
CPC ............. H01L 27/0629; H01L 27/0727; H01L 27/0733; H01L 27/0788; H01L 27/108; H01L 27/10847; H01L 27/1085; H01L 29/92; H01L 29/93; H01L 29/66174; H01L 2924/1436; H01L 23/5222–5225; H01L 27/0288; H01L 27/0635; H01L 27/0647; H01L 27/0658; H01L 27/0664; H01L 27/067; H01L 27/0676; H01L 27/0682;
(Continued)

(56) References Cited

U.S. PATENT DOCUMENTS 5,759,882 A *  6/1998  Kao ............... H01L 21/768
                                                438/202
5,766,992 A    6/1998  Chou et al.
(Continued)

FOREIGN PATENT DOCUMENTS

KR    20040040855 A    5/2004
TW     201041149 A    11/2010

*Primary Examiner* — Sonya McCall-Shepard
(74) *Attorney, Agent, or Firm* — Eschweiler & Potashnik, LLC

(57) ABSTRACT

A semiconductor device and a manufacturing method thereof are provided. The semiconductor device has a substrate having isolation structures therein and a capacitor structure located on a top surface of the isolation structure. The capacitor structure comprises a semiconductor material pattern and an insulator pattern inlaid in the semiconductor material pattern. The semiconductor material pattern and the insulator pattern are located at a same horizontal level on the isolation structure.

20 Claims, 14 Drawing Sheets

(51) Int. Cl.
  *H01L 27/06* (2006.01)
  *H01L 23/64* (2006.01)
  *H01L 21/8234* (2006.01)

(58) Field of Classification Search
  CPC ...... H01L 27/0711–0733; H01L 27/075–0755; H01L 27/0777; H01L 27/0783; H01L 27/0794; H01L 27/0805; H01L 27/101; H01L 27/1082; H01L 27/10829; H01L 27/10832; H01L 27/10838; H01L 27/10852; H01L 27/10858–10876; H01L 27/11502; H01L 27/1255; H01L 28/40–57; H01L 29/7408; H01L 29/66189; H01L 29/66181; H01L 2924/1205; H01L 2924/19041; H01L 2027/11842
  See application file for complete search history.

(56) References Cited

U.S. PATENT DOCUMENTS

| | | | |
|---|---|---|---|
| 6,107,128 | A | 8/2000 | Ishii et al. |
| 6,627,935 | B2 | 9/2003 | Kowarik et al. |
| 9,035,352 | B2 | 5/2015 | Boselli et al. |
| 2005/0073800 | A1* | 4/2005 | Chou ............ H01L 28/82 361/306.1 |
| 2007/0152241 | A1* | 7/2007 | Ahn ............ H01L 27/0805 257/202 |
| 2009/0072290 | A1* | 3/2009 | Cheng ............ H01L 27/1203 257/303 |
| 2009/0095995 | A1* | 4/2009 | Kawashima ...... H01L 27/11526 257/296 |
| 2016/0064471 | A1* | 3/2016 | Moll ............ H01L 21/28132 257/300 |

* cited by examiner

SEMICONDUCTOR DEVICE HAVING HIGH VOLTAGE LATERAL CAPACITOR AND MANUFACTURING METHOD THEREOF

REFERENCE TO RELATED APPLICATION

This Application claims priority to U.S. Provisional Application No. 62/690,430, filed on Jun. 27, 2018, the contents of which are hereby incorporated by reference in their entirety.

BACKGROUND

Following the rapid progress in shrinking sizes of semiconductor devices and/or electronic components, more small devices and/or components are to be integrated into a given area, leading to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
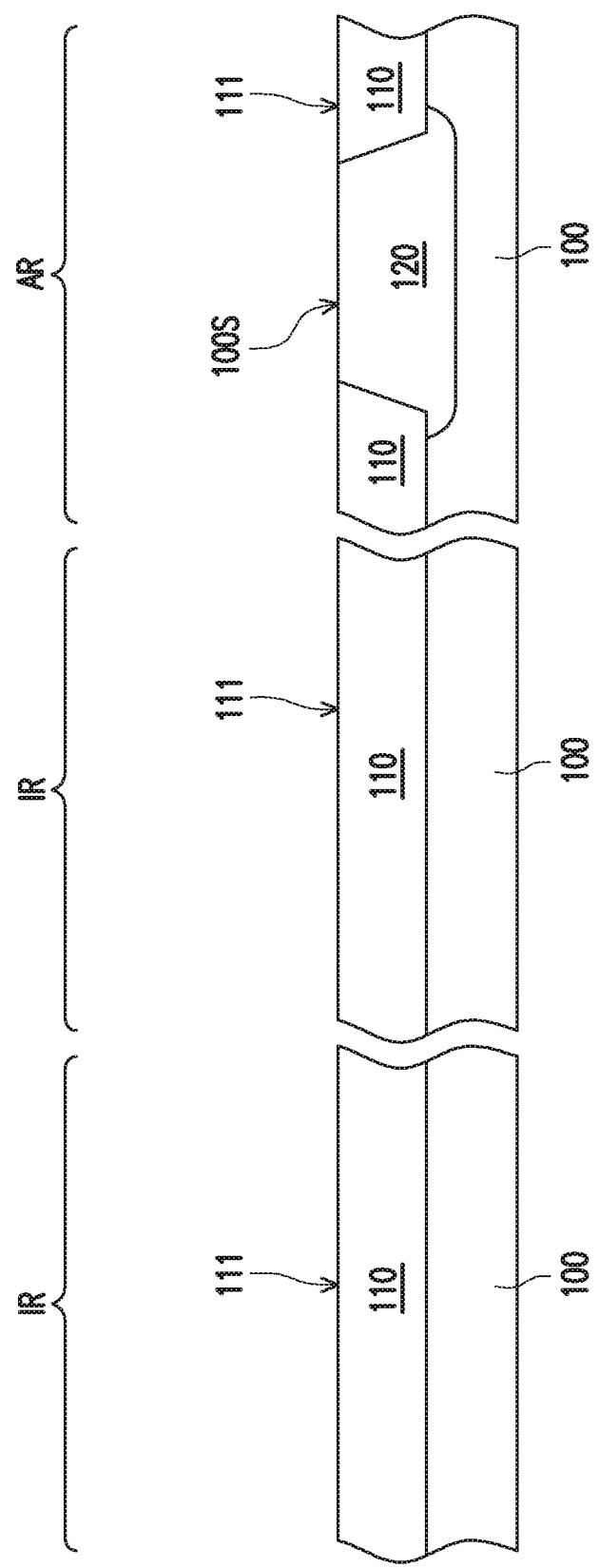
FIG. 1 to FIG. 7 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor capacitors and the integration structures fabricated there-from. Certain embodiments of the present disclosure are related to the structures including semiconductor capacitors and other semiconductor devices. Other embodiments relate to semiconductor devices including polysilicon-insulator-polysilicon capacitor (PIP) structures located on insulated isolation structure(s). The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

Figure 8:
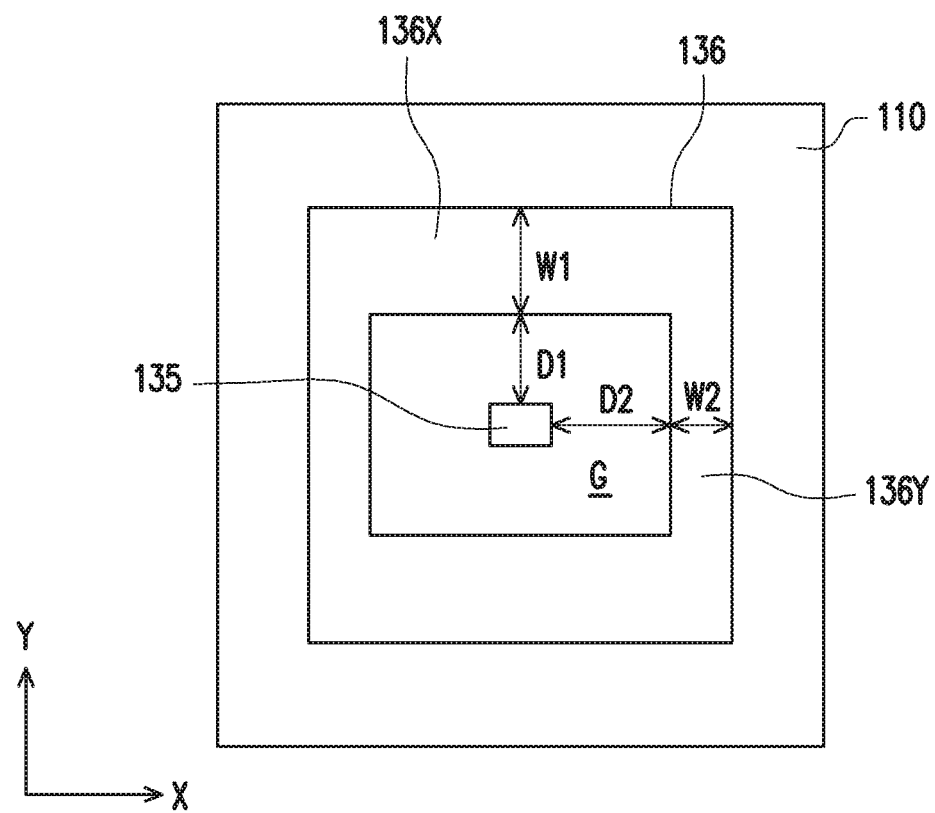
FIG. 8 to FIG. 10 are schematic top view showing a portion of the structure including a capacitor structure in accordance with some embodiments of the disclosure.
Figure 9:
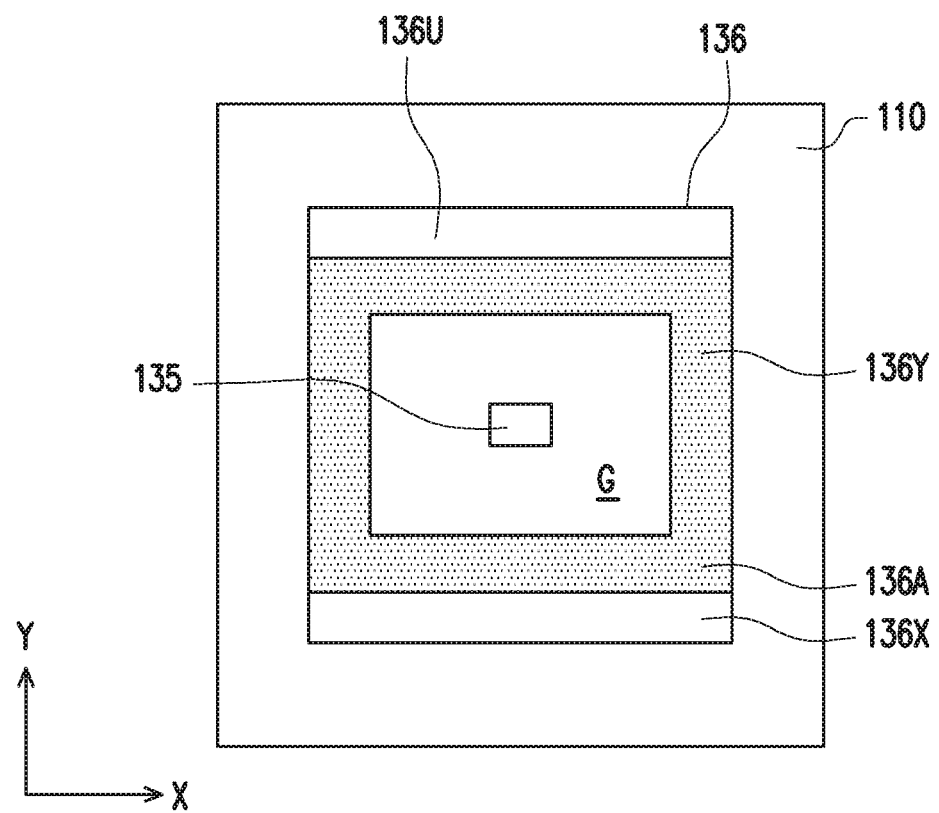
Figure 10:
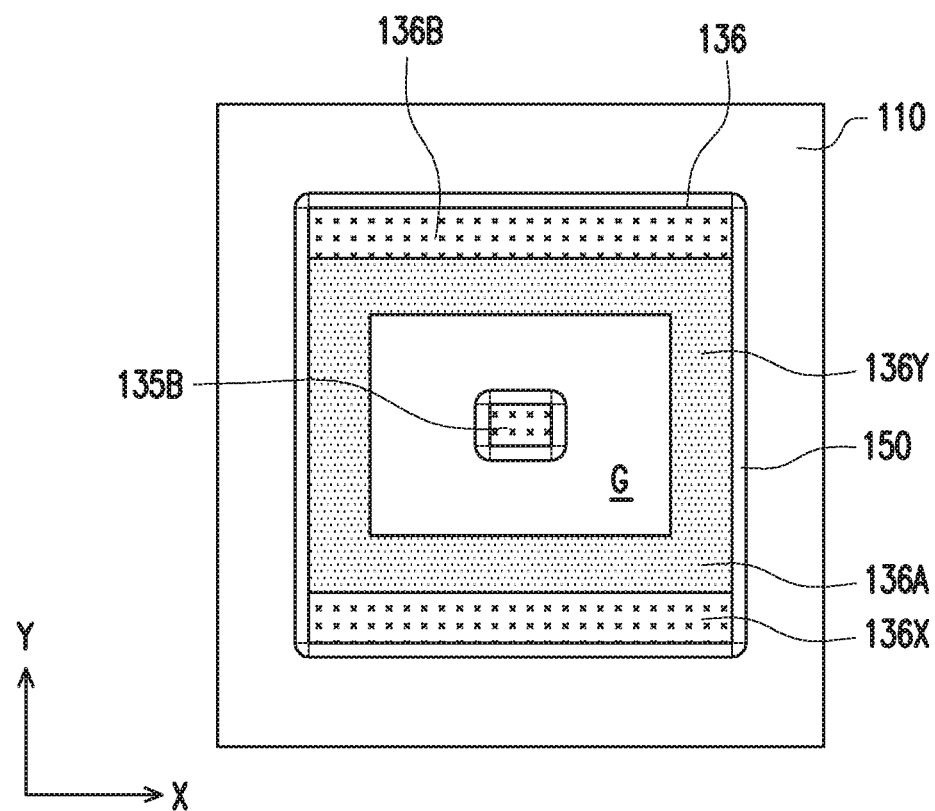
Figure 11:
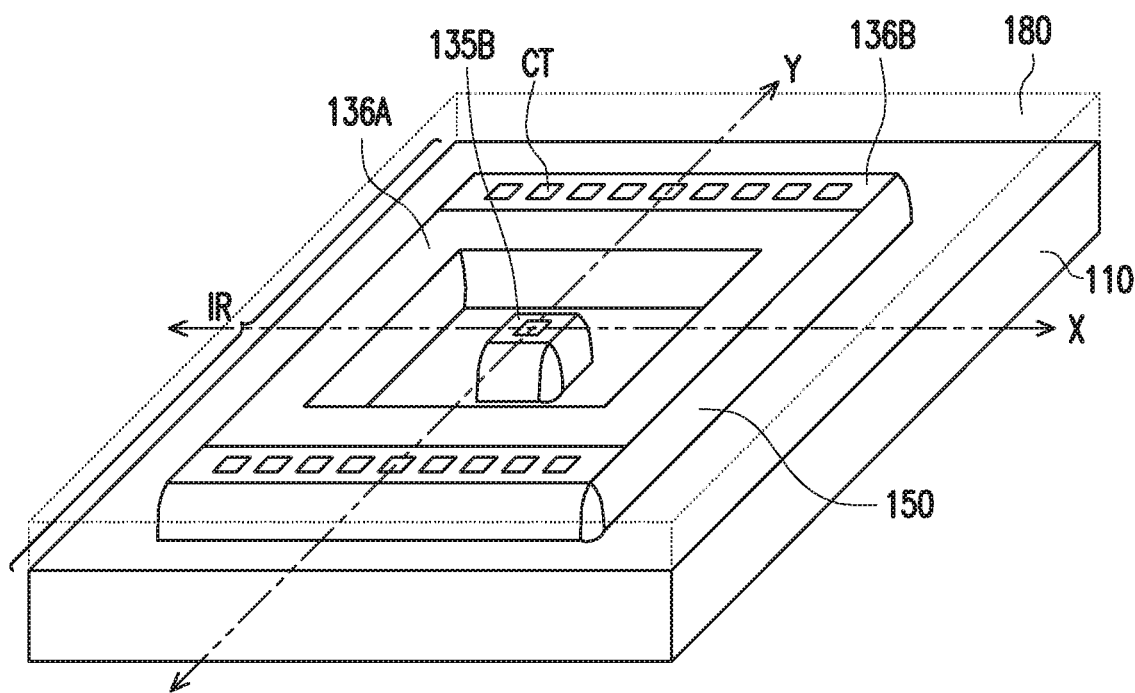
FIG. 11 is a schematic perspective view showing a portion of the structure including a capacitor structure in accordance with some embodiments of the disclosure.

FIG. 1 to FIG. 7 are schematic cross-sectional views of various stages in a manufacturing method of a semiconductor device in accordance with some embodiments of the disclosure. From FIG. 1 through FIG. 7, three portions from the left to the right respectively represent the schematic views of cross-sections along Y axis and X axis of an isolating region IR and schematic cross-section views of an active region AR. FIG. 8 to FIG. 10 are schematic top views showing a portion of the structure in the isolating region IR in accordance with some embodiments of the disclosure. FIG. 11 is a schematic perspective view showing the structure including a capacitor structure in the isolating region IR in accordance with some embodiments of the disclosure.

Referring to FIG. 1, in some embodiments, a substrate 100 having one or more isolation structure 110 therein is provided. As shown in FIG. 1, in some embodiments, the isolation structures 110 define an active region AR and an isolating region IR separating and isolating the active region AR. In some embodiments, one or more active component such as transistors, diodes, optoelectronic devices or the like are formed in the active region AR, while one or more passive components such as capacitors are formed in the isolating region IR. In some embodiments, the substrate 100 includes a capacitor region formed with one or more semiconductor capacitors in the isolating region IR. In some embodiments, the substrate 100 includes a transistor region formed with one or more transistors in the active region AR.

In some embodiments, the substrate 100 is a semiconductor substrate. In one embodiment, the substrate 100 comprises a crystalline silicon substrate (e.g., wafer). In certain embodiments, the substrate 100 may be a doped semiconductor substrate (e.g., p-type substrate or n-type substrate). In certain embodiments, the substrate 100 comprises one or more doped regions or various types of doped regions, depending on design requirements. In some embodiments, the doped regions are doped with p-type and/or n-type dopants. For example of a non-limiting purpose, the p-type dopants are boron or $BF_2$ and the n-type dopants are phosphorus or arsenic. The doped regions may be configured for an n-type metal-oxide-semiconductor (MOS) transistor or a p-type MOS (PMOS) transistor. In some alternative embodiments, the substrate 100 is made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 1, in some embodiments, more than one isolation structure 110 is formed in the substrate 100. In certain embodiments, the isolation structures 110 are trench isolation structures. The formation of the trench isolation structures includes partially covering the substrate 100 with a photoresist pattern (not shown), patterning the substrate 100 to form trenches in the substrate 100 and filling the trenches with an insulator material. For example, the photoresist pattern includes a predetermined pattern with openings corresponding to the predetermined locations of the isolation structures. In some embodiments, as shown in FIG. 1, top surfaces 111 of the isolation structures 110 are substantially leveled with the top surface 100S of the substrate 100. In some embodiments, the top surface 100S of the substrate 100 is substantially leveled with the top surface 111 of the isolation structure 110. In one embodiment, after filling the insulator material in the trenches, a planarization process such as a mechanical grinding process or chemical mechanical polishing process is performed to remove extra insulator material. In some embodiments, the insulator material of the isolation structures 110 includes silicon oxide, silicon nitride, silicon oxynitride, a spin-on dielectric material, or a low-k dielectric material. In one embodiment, the insulator material of the isolation structures 110 may be formed by high-density-plasma chemical vapor deposition (HDP-CVD), sub-atmospheric CVD (SACVD) or by spin-on.

The number of the isolation structures 110 shown in FIG. 1 is merely for illustration, in some alternative embodiments, more than two isolation structures may be formed in accordance with actual design requirements. In some embodiments, the isolation structures 110 include shallow trench isolation structures. In other embodiments, the isolation structures 110 includes local oxidation of silicon (LOCOS) structures. In some embodiments, the isolation structures 110 are shaped as rings, strips or blocks and arranged aside the active region(s) or in parallel, and it is understood that the shape(s) and size(s) of the isolation structures are not limited by the embodiments herein. In one embodiment, an optional cleaning process may be performed to remove a native oxide of the substrate 100. The cleaning process may be performed using diluted hydrofluoric (DHF) acid or other suitable cleaning solutions. In one embodiment, an isolation implantation process may be performed to strengthen the isolation effects.

Referring to FIG. 1, a diffusion region 120 is formed in the substrate 100 within the active region AR (e.g. within the transistor region). The diffusion region 120 is a well region doped with dopants of one conductive type. In some embodiments, the diffusion region 120 is an N-type well (N-well) region. In one embodiment, the diffusion region 120 is doped with phosphorus as an N-well region for a PMOS transistor following the CMOS processes. In some embodiments, the diffusion region 120 is a P-type well region (P-well) region. In one embodiment, the diffusion region 120 is doped with boron as a P-well region for an NMOS transistor following the CMOS processes. In certain embodiments, the diffusion region(s) 120 is formed by performing ion implantation to the exposed substrate 100 using a photoresist pattern (not shown) partially covering the substrate 100 as the mask, and a thermal process is performed to further drive the dopants into the substrate to form the diffusion region 120. In one embodiment, the diffusion region 120 is formed in the regions exposed by the photoresist pattern and the diffusion region 120(s) is formed only in the active region AR. In some embodiments, the diffusion region 120 is deeper than the isolation structure(s) 110. That is, the depth of the isolation structure 110 (measuring from the top surface 100S of the substrate 100) is smaller than the depth of the diffusion region 120.

Figure 2:
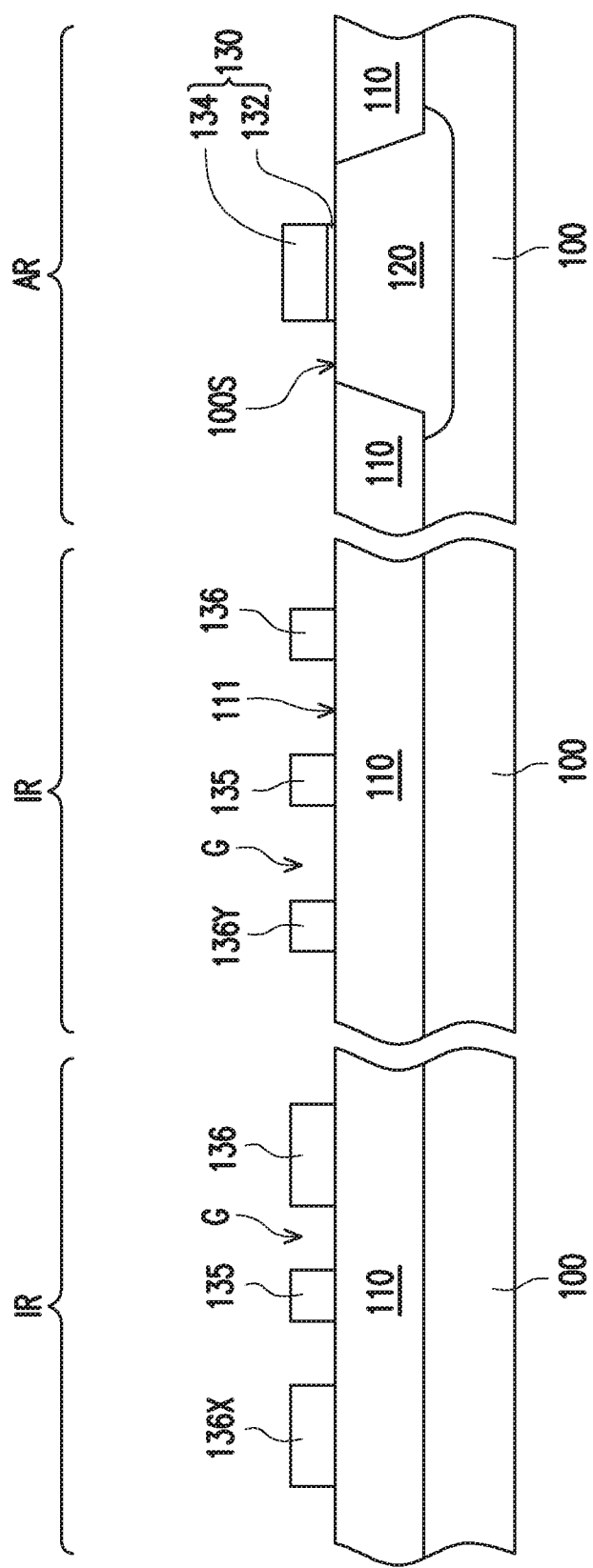

In some embodiments, a dielectric pattern 132 and a semiconductor material pattern 134 are formed over the substrate 100 and on the diffusion region 120 in the active region AR as shown in the right portion of FIG. 2, while the semiconductor material patterns 135, 136 are formed over the substrate 100 and on the isolation structures 110 in the isolating region IR as shown in the middle and left portions of FIG. 2. In some embodiments, the formation of the dielectric pattern 132 includes forming a mask pattern (not shown) protecting the isolating region IR, forming a dielectric material layer (not shown) covering the active region AR of the substrate 100 and patterning the dielectric material layer to form the dielectric pattern 132 in the active region AR. In one embodiment, the dielectric material for forming the dielectric pattern 132 includes an oxide material such as silicon oxide. In one embodiment, the dielectric material for forming the dielectric pattern 132 includes silicon oxide, silicon nitride, silicon oxynitride or combinations thereof. In some embodiments, the formation of the semiconductor material patterns 134, 135, 136 includes forming a semiconductor material blanketly over the substrate 100 and patterning the semiconductor material to form the semiconductor material pattern(s) 134 in the active region AR and to form the semiconductor material patterns 135, 136 in the isolating region IR. In the embodiments, the semiconductor material for forming the semiconductor material patterns 134, 135, 136 includes doped or undoped polysilicon. The semiconductor material may be formed by chemical vapor deposition (CVD) such as low-pressure CVD (LPCVD) or plasma-enhanced CVD (PECVD) or crystallization or amorphous silicon.

In certain embodiments, as shown in the right portion of FIG. 2, the semiconductor material is deposited on the dielectric material layer in the active region AR, and the patterning of the dielectric material layer and the semiconductor material may include performing one or more etching processes to etch the dielectric material layer and the semiconductor material using the same mask pattern, at the same time or in sequence. In some embodiments, the semiconductor material pattern 134 and dielectric pattern 132 are patterned into a stacked strip structure 130 in the active region AR. In one embodiment, the stacked structure 130 may function as a gate stack, and the semiconductor material pattern 134 and dielectric pattern 132 function as the gate electrode and gate dielectric layer of the stacked structure 130.

In certain embodiments, as shown in the left and middle portions of FIG. 2, the semiconductor material is deposited over the substrate 100 and directly on the isolation structure(s) 110 in the isolating region IR, and the patterning of the semiconductor material may include performing one or more etching processes to etch the semiconductor material. In some embodiments, the semiconductor material formed in the active region AR and in the isolating region IR is patterned in the same process. In some embodiments, the semiconductor material formed in the active region AR and in the isolating region IR is patterned individually through different processes.

FIG. 8 is a schematic top view showing a portion of the structure including the patterned structures 135 and 136 in accordance with some embodiments of the disclosure. In some embodiments, referring to FIG. 8, the semiconductor material patterns 136 and 135 are shaped as a ring structure and an islet structure surrounded by the ring structure but with a gap or space G in-between. The semiconductor material pattern 135 is spaced apart from the ring structure of the semiconductor material pattern 136 with a distance D1 in Y axis direction and a distance D2 in X axis direction. In one embodiment, the ring structure of the semiconductor material pattern 136 includes portions 136Y of the semiconductor material pattern 136 extending in Y axis (Y-portions) and portions 136X of the semiconductor material pattern 136 extending in X axis (X-portions). In one embodiment, the Y-portion 136Y has a width W2 smaller than the width W1 of the X-portions 136X. In another embodiment, the Y-portion 136Y has a width W2 larger than the width W1 of the X-portions 136X. In another embodiment, the Y-portion 136Y has a width W2 substantially equivalent to the width W1 of the X-portions 136X.

In some other embodiments, the semiconductor material in the isolating region IR may be patterned into more than one strip structures arranged substantially in parallel.

In some embodiments, the semiconductor material patterns 134, 135 and 136 are formed from patterning the same layer of semiconductor material in the active region AR and the isolating region IR. That is, the material of the semiconductor material patterns 134, 135 and 136 is the same. In addition, the formation of the semiconductor material patterns 135 and 136 may be accomplished through some or parts of the processes for forming the gate stacked structure in the CMOS process.

Figure 3:
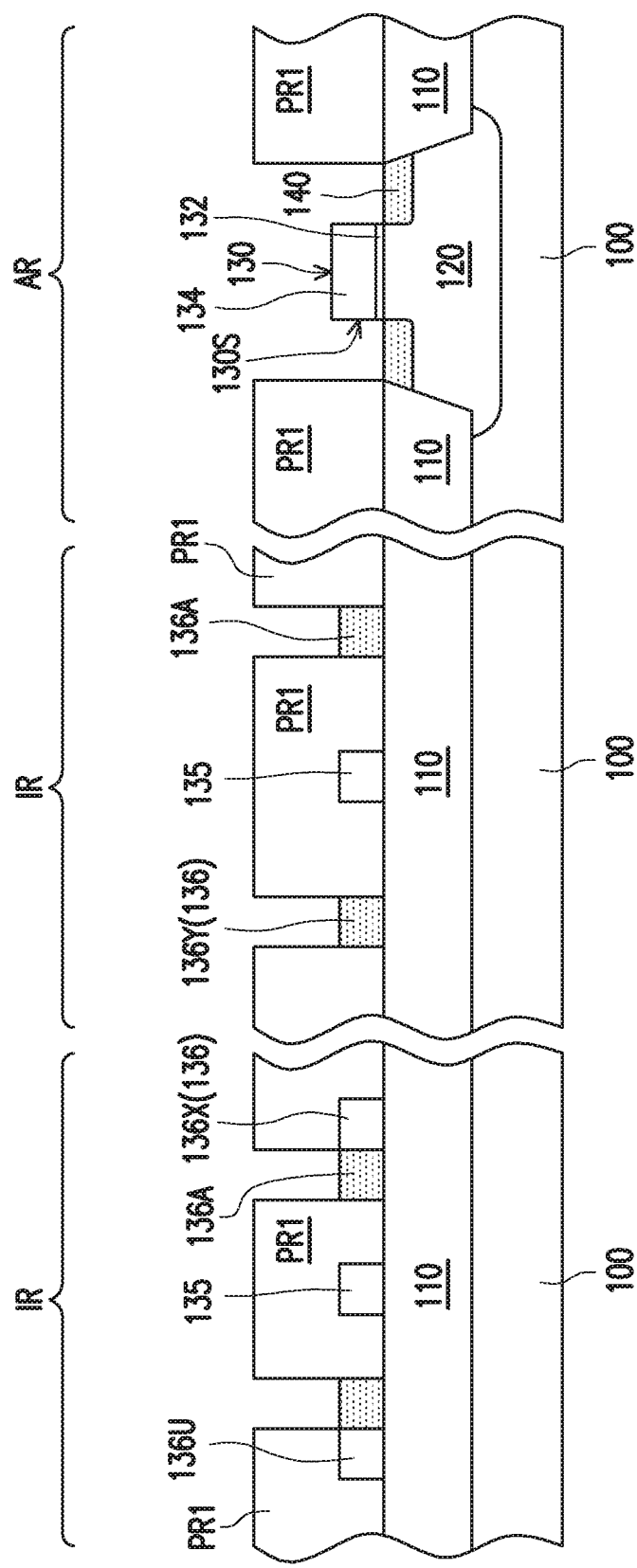

In some embodiments, as shown in right portions of FIG. 3, lightly doped drain (LDD) regions 140 are formed within the diffusion region 120, in the substrate 100, at both opposite sides of the stacked structure 130 and within the active region AR (e.g. within the transistor region). In certain embodiments, the LDD regions 140 are lightly doped regions with dopants of a conductive type that is different from the conductive type of the diffusion region 120. In some embodiments, the diffusion region 120 is an N-well region, and the LDD regions 140 are P-type lightly doped regions. In some embodiments, the diffusion region 120 is a P-well region, and the LDD regions 140 are N-type lightly doped regions. In one embodiment, the LDD regions 140 are lightly doped with dopants as LDD regions for NMOS and/or PMOS transistors following the CMOS processes. After the formation of the LDD regions 140, the photoresist pattern PR1 is removed.

In one embodiment, the LDD regions 140 have a first doping concentration. In certain embodiments, as shown in FIG. 3, the LDD regions 140 are formed in the active region AR by performing ion implantation to the exposed substrate 100 using the stacked structure 130 and photoresist pattern PR1 partially covering the isolation structures 110 as the masks. In one embodiment, the LDD regions 140 are formed only in the active region AR. In some embodiments, the LDD regions 140 are shallower than the isolation structure(s) 110 and the diffusion region 120. In certain embodiments, under the condition that the LDD regions 140 are N-type lightly doped regions for fabricating the NMOS transistor, N-type dopants such as phosphorous atoms may be doped with a dopant concentration ranging from $1*10^{13}$ to $1*10^{15}$ atoms per square centimeter, and the ion implanting process may provide a doping energy of 20 to 100 keV, for example of a non-limiting purpose.

In some embodiments, the LDD regions 140 are formed in the substrate 100 and along sidewalls 130S of the stacked structure 130. In some embodiments, the LDD regions 140 formed at both opposite sides of the stacked structure 130 are symmetric LDD regions having the same doping concentration and the same extension width. In alternative embodiments, the LDD regions 140 formed at both opposite sides of the stacked structure 130 are asymmetric LDD regions with different extension widths. In general, leakage current and hot carrier effect can be effectively improved by forming the LDD regions in the transistors.

FIG. 9 is a schematic top view showing a portion of the structure including the patterned structures 135 and 136 in accordance with some embodiments of the disclosure. In some embodiments, as shown in left and middle portions of FIG. 3, the semiconductor material pattern 136 in the isolating region IR is lightly doped into lightly doped portions 136A. In the left portion of FIG. 3, the X-portions 136X are partially doped to form the lightly doped portions 136A, while the Y-portions 136Y are doped into lightly doped portions 136A as shown in the middle portion of FIG. 3. In one embodiment, the lightly doped portions 136A are formed in the isolating region IR through the same ion implantation process for forming the LDD regions 140 in the active region AR. In certain embodiments, the lightly doped portions 136A are formed in the regions exposed by the photoresist pattern PR1 and the lightly doped portions 136A are formed only in the isolating region IR. In one embodiment, the photoresist pattern PR1 protects the semiconductor material pattern 135 and portions of the semiconductor material pattern 136 from being implanted, so that the lightly doped portions 136A are formed by doping the Y-portions 136Y and parts of the X-portions 136X. Referring to FIG. 3 and FIG. 9, the ring structure of the semiconductor material pattern 136 includes the lightly doped portions 136A (as a ring structure in FIG. 9) and undoped portions 136U of X-portions 136X. In some embodiments, the semiconductor material pattern 135 is not doped in the ion implantation process for forming the LDD regions 140 and the lightly doped portions 136A.

In some embodiments, the lightly doped portions 136A and the undoped portion 136U in the isolating region IR and the LDD regions 140 in the active region AR are formed from the same ion implantation process. That is, the same doping conditions may be used and the doping concentrations in these portions/regions are the same. In some embodiments, the lightly doped portions 136A have substantially the same doping concentration as the first doping concentration of the LDD regions 140. In addition, the formation of the light doped portions 136A and the undoped portion 136U may be accomplished through some or parts of the processes for forming the LDD regions in the CMOS process.

Figure 4:
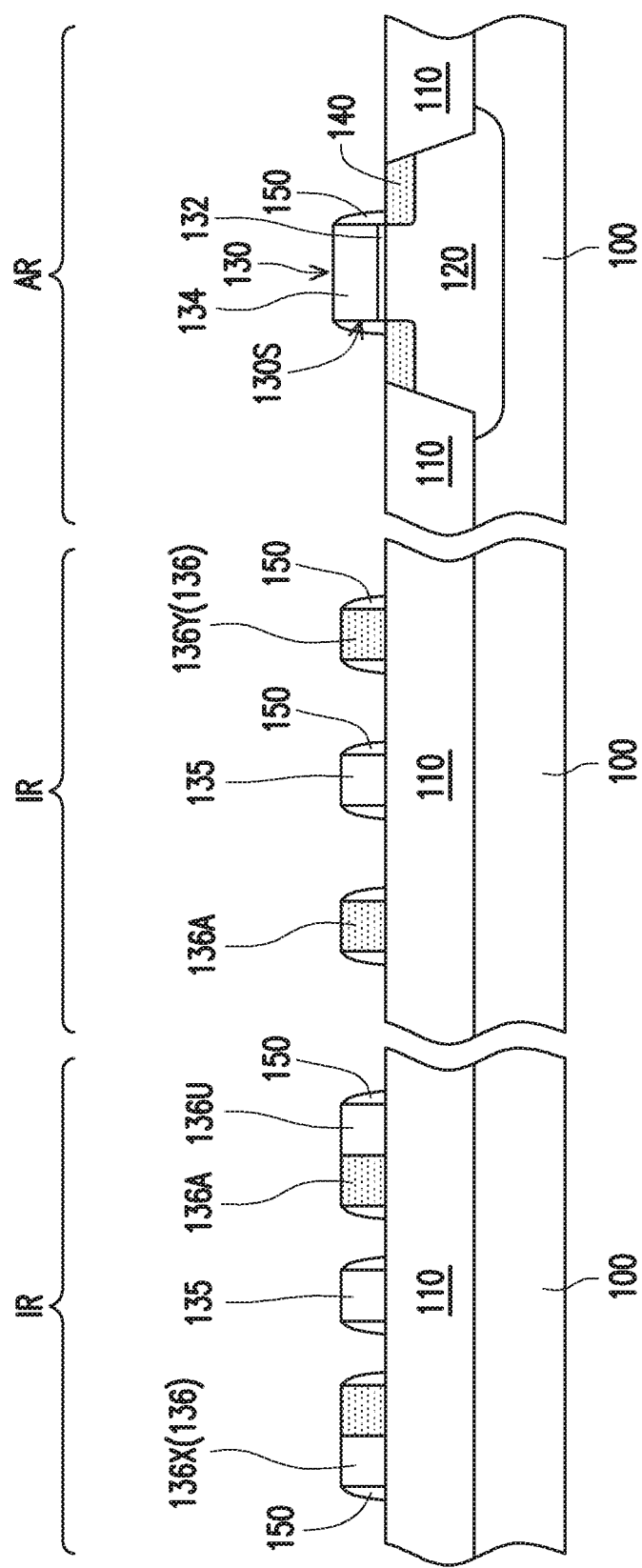

As shown in FIG. 4, in some embodiments, spacers 150 are formed on the sidewalls 130S of the stacked structure 130 in the active region AR, and spacers 150 are formed on sidewalls of the semiconductor material patterns 135 and 136. In certain embodiments, the formation of the spacers 150 includes forming a spacer material layer (not shown) over the substrate 100, conformally covering the stacked strip structure 130 and conformally covering the semiconductor material patterns 135 and 136, and etching back the spacer material layer to form the spacers 150. In some embodiments, the spacer material layer is formed of one or more dielectric materials, such as silicon oxide, silicon nitride, silicon carbon oxynitride (SiCON), silicon carbonitride (SiCN) or combinations thereof. In some embodiments, the spacers 150 may be a single layer or a multilayered structure.

In some embodiments, the spacers 150 formed on the sidewalls 130S of the stacked structure 130 in the active region AR and formed on sidewalls of the semiconductor material patterns 135 and 136 in the isolating region IR are formed from the same spacer material layer and through the same etching back process. In some other embodiments, the spacers 150 are formed only on the sidewalls 130S of the stacked structure 130 in the active region AR, while no spacers 150 are formed on sidewalls of the semiconductor material patterns 135 and 136, as the isolating region IR may be masked during the formation of the spacers 150.

Figure 5:
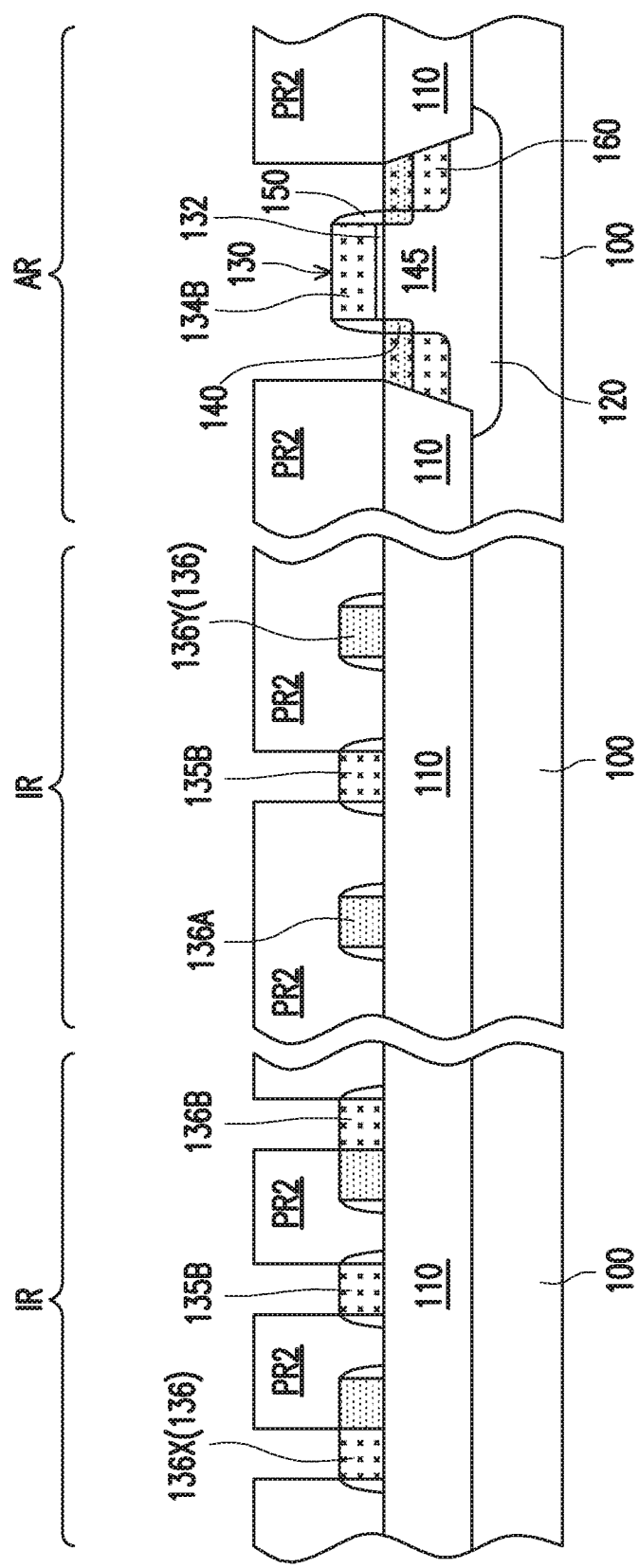

In some embodiments, referring to right portion of FIG. 5, source and drain (S/D) regions 160 are formed within the diffusion region 120, in the substrate 100, at both opposite sides of the stacked structure 130 and within the active region AR (e.g. within the transistor region). In certain embodiments, the S/D regions 160 are heavily doped regions with dopants of a conductive type that is the same as that of the LDD region 140 but is different from that of the diffusion region 120. In some embodiments, the diffusion region 120 is an N-well region, and the S/D regions 160 are P-type heavily doped regions. In some embodiments, the diffusion region 120 is a P-well region, and the S/D regions 160 are N-type heavily doped regions. In one embodiment, the S/D regions 160 are heavily doped with dopants as source and drain regions for NMOS and/or PMOS transistors following the CMOS processes. In one embodiment, after the formation of the S/D regions 160, the photoresist pattern PR2 is removed.

In one embodiment, the S/D regions 160 have a second doping concentration larger than the first doping concentration of the LDD regions 140. In certain embodiments, as shown in FIG. 5, the S/D regions 160 are formed in the active region AR by performing ion implantation to the exposed substrate 100 using the spacers 150, the stacked structure 130 and photoresist pattern PR2 partially covering the isolation structures 110 as the masks. In one embodiment, the S/D regions 160 are formed only in the active region AR. In some embodiments, the S/D regions 160 are shallower than the isolation structure(s) 110 and the diffusion region 120 but are deeper than the LDD regions 140. In certain embodiments, under the condition that the S/D regions 160 are N-type heavily doped regions for fabricating the NMOS transistor, N-type dopants such as phosphorous atoms may be doped with a dopant concentration ranging from $1*10^{15}$ to $1*10^{16}$ atoms per square centimeter, the ion implanting process may provide a doping energy of 3 to 50 keV, for example of a non-limiting purpose. In one embodiment, during the ion implantation process, the semiconductor material pattern 134 of the stacked structure 130 is also doped and becomes the doped semiconductor material pattern 134B.

In some embodiments, the S/D regions 160 are formed in the substrate 100 and along outer sidewalls of the spacers 150 beside the stacked structure 130. In certain embodiments, a channel region 145 is positioned in the substrate 100 (within the diffusion region 120) between the S/D regions 160 and under the stacked structure 130, and the S/D regions 160 are positioned beside the channel region 145. In some embodiments, the S/D regions 160 formed at both opposite sides of the stacked structure 130 are symmetric source and drain regions having the same doping concentration and the same extension width. In alternative embodiments, the S/D regions 160 formed at both opposite sides of the stacked structure 130 are asymmetric source and drain regions with different extension widths.

FIG. 10 is a schematic top view showing a portion of the structure including the patterned structures 135B and 136 in accordance with some embodiments of the disclosure. In some embodiments, as shown in left and middle portions of FIG. 5, the semiconductor material pattern 135 and the undoped portions 136U (FIG. 3 & FIG. 9) in the isolating region IR are doped respectively into heavily doped portions 135B and 136B. In the left portion of FIG. 5, the X-portions 136X are partially doped to form the heavily doped portions 136B, while the lightly doped portions 136A of the X-portions 136X are not further doped and remain lightly doped. As shown in the middle portion of FIG. 5, the Y-portions 136Y are not further doped and remain to be lightly doped portions 136A, but the uncovered semiconductor material pattern 135 is heavily doped into the heavily doped portion 135B. In one embodiment, the heavily doped portions 135B and 136B are formed in the isolating region IR through the same ion implantation process for forming the S/D regions 160 in the active region AR. In certain embodiments, the heavily doped portions 135B and 136B are formed in the regions exposed by the photoresist pattern PR2 and the heavily doped portions 135B and 136B are formed only in the isolating region IR. In one embodiment, the photoresist pattern PR2 protects the lightly doped portions 136A but exposes the semiconductor material pattern 135 and portions of the semiconductor material pattern 136, so that the heavily doped portions 135B and 136B are formed by doping the semiconductor material pattern 135 and undoped portions 136U. Referring to FIG. 5 and FIG. 10, the ring structure of the semiconductor material pattern 136 includes the lightly doped portions 136A (as a ring structure in FIG. 10) and heavily doped portions 136B of X-portions 136X. In some embodiments, the semiconductor material pattern 135 is doped into the heavily doped portion 135B during the ion implantation process for forming the S/D regions 160 and the heavily doped portions 136B.

In some embodiments, the heavily doped portions 135B and 136B in the isolating region IR and the S/D regions 160 in the active region AR are formed from the same ion implantation process. That is, the same doping conditions may be used and the doping concentrations in these portions/ regions are the same. In some embodiments, the heavily doped portions 135B and 136B have substantially the same doping concentration as the second doping concentration of the S/D regions 160. In addition, the formation of the heavily doped portions 135B and 136B may be accomplished through some or parts of the processes for forming the source and drain regions in the CMOS process.

Figure 6:
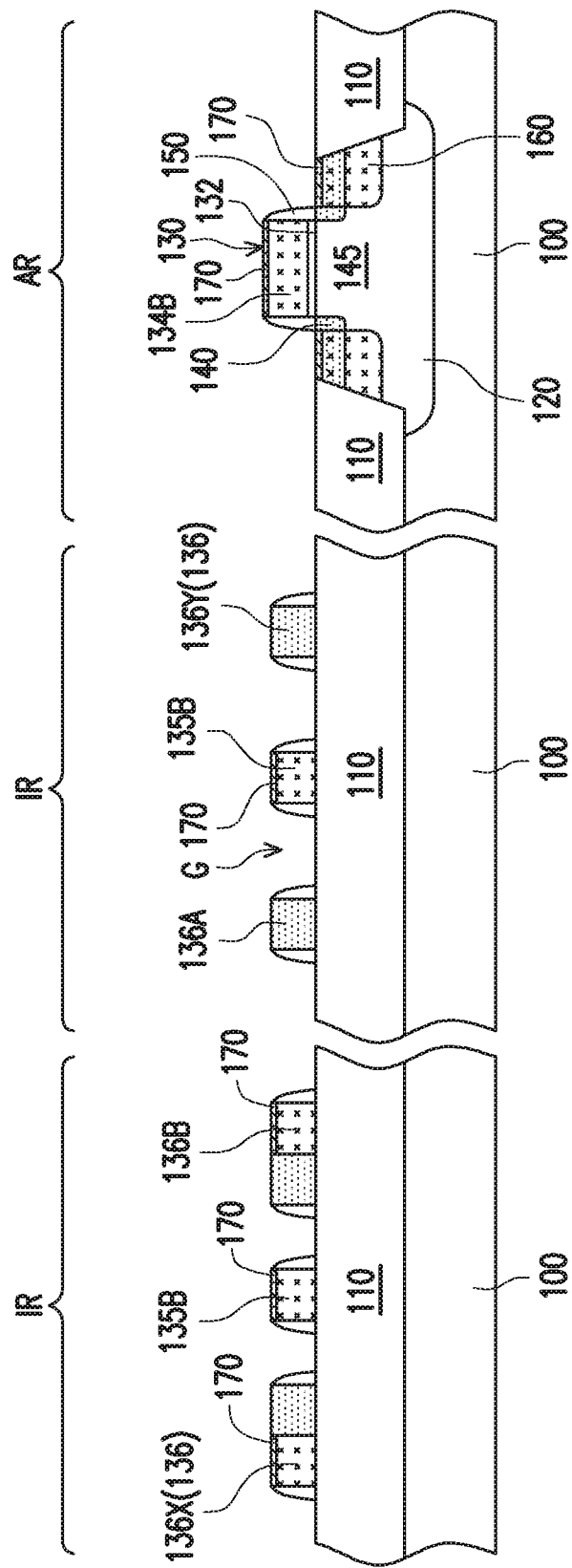

Referring to FIG. 6, in some embodiments, silicide top layers 170 are formed on the doped semiconductor material pattern 134, the S/D regions 160 and on the heavily doped portions 135B and 136B by silicidation. In some embodiments, a self-aligned silicide (salicide) process is usually included in a MOS transistor process to reduce the resistance of the S/D regions and silicon gates. In one embodiment, the salicide process includes forming a layer of refractory metal over the substrate 100, thermally reacting the silicon or semiconductor material at the surfaces of S/D regions and of the semiconductor material patterns with the metal to form a metal silicide layer and then removing the unreacted metal. In certain embodiments, the photoresist pattern PR2 is not removed until the self-aligned silicide process is finished. In some embodiments, the regions that are not intended to be formed with silicide are protected by a masking material (not shown), which is later removed. In some embodiments, the material of the silicide top layer 170 is, for example of a non-limiting purpose, a silicide of Ni, Co, Ti, Cu, Mo, Ta, W, Er, Zr, Pt, Yb, Gd, Dy or an alloy of any two thereof. In one embodiment, the material of the silicide top layer 170 is titanium silicide, cobalt silicide, nickel silicide or nickel platinum silicide.

Figure 7:
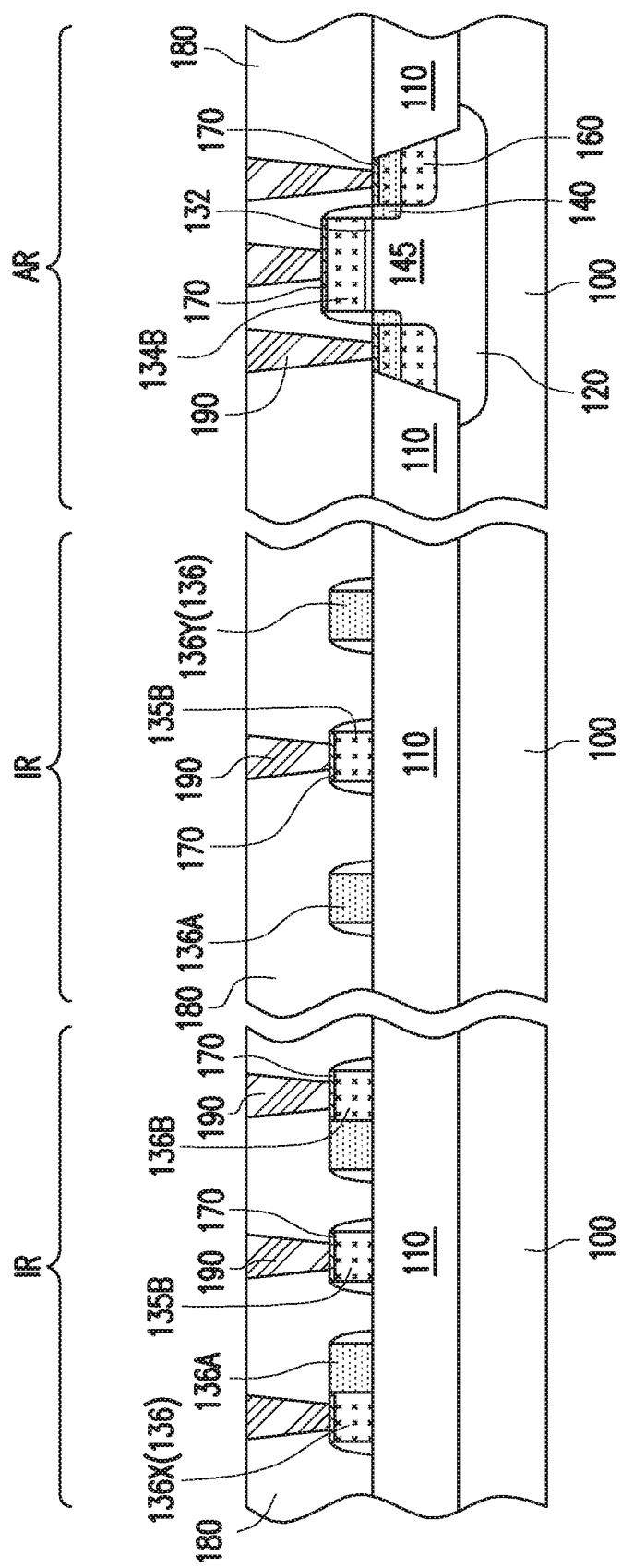

Referring to FIG. 7, in some embodiments, an inter-layer dielectric (ILD) layer 180 is formed as a blanket layer over the substrate 100 to fully cover the stacked structure 130, the S/D regions 160 and the isolation structures 110 in the active region AR, and to fully cover the portions 135B, 136A and 136B in the isolating region IR. In one embodiment, the material of the ILD layer 180 may include silicon oxide. In one embodiment, the material of the ILD layer 180 may include silicate glass such as phospho-silicate-glass (PSG) and boro-phospho-silicate-glass (BPSG). In one embodiment, the material of the ILD layer 180 may include a low-k dielectric material. In certain embodiment, the ILD layer 180 may further be planarized and covered by a passivation layer (not shown) thereon.

FIG. 11 is a schematic perspective view showing a portion of the structure including a capacitor structure in accordance with some embodiments of the disclosure. The structure of FIG. 11 may be fabricated following the process steps depicted from FIG. 1 to FIG. 5 and FIG. 7. Only a portion of the structure in the isolating region IR is shown in FIG. 11. As shown in FIG. 11, the structure includes spacers 150 formed on sidewalls of the portions 135B, 136A and 136B, while the locations for the to-be formed contacts are labelled as CT. In FIG. 11, the lightly doped portions 136A form a ring-shaped structure, and the heavily doped portion 135B is located in the middle of the ring-shaped structure like an islet and spaced apart from the ring-shaped structure. In FIG. 11, the ILD layer 180 is formed between the lightly doped portions 136A and the heavily doped portions 136B. The ILD layer 180 is also formed outside the ring-shaped structure of the lightly doped portions 136A and the heavily doped portions 136B.

Figure 12A:
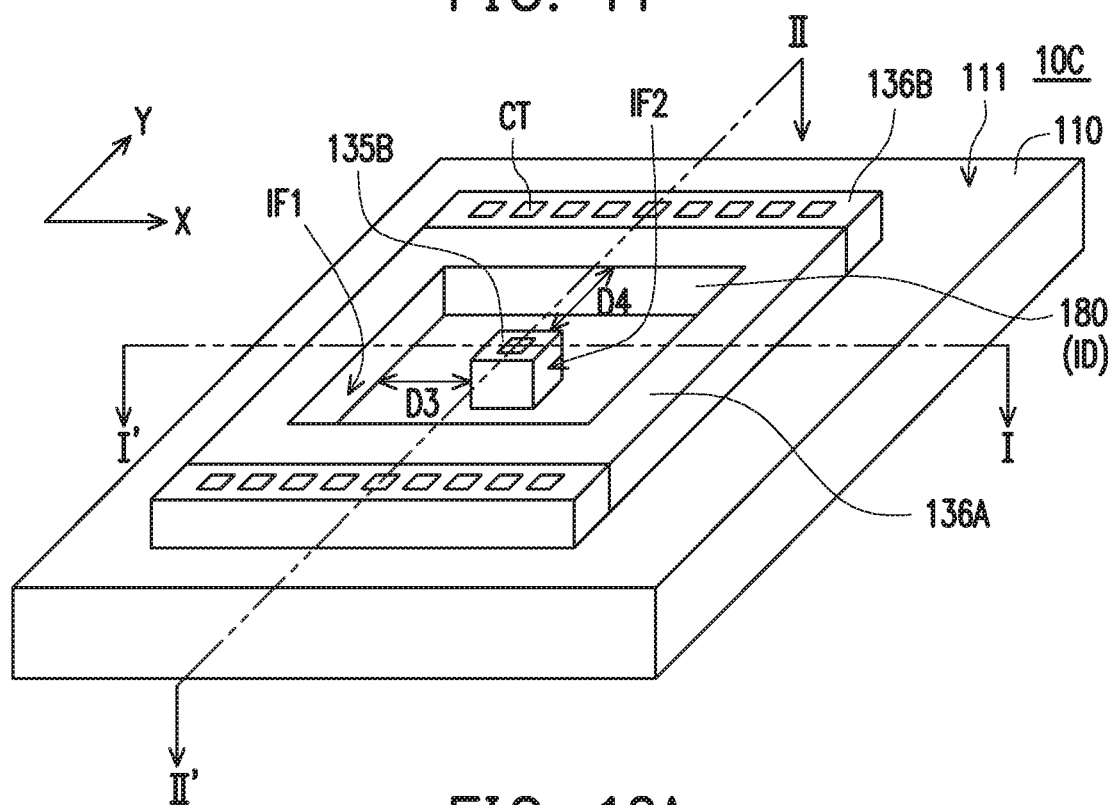
FIG. 12A is a schematic perspective view showing a portion of the structure including a capacitor structure in accordance with some embodiments of the disclosure.
Figure 12C:
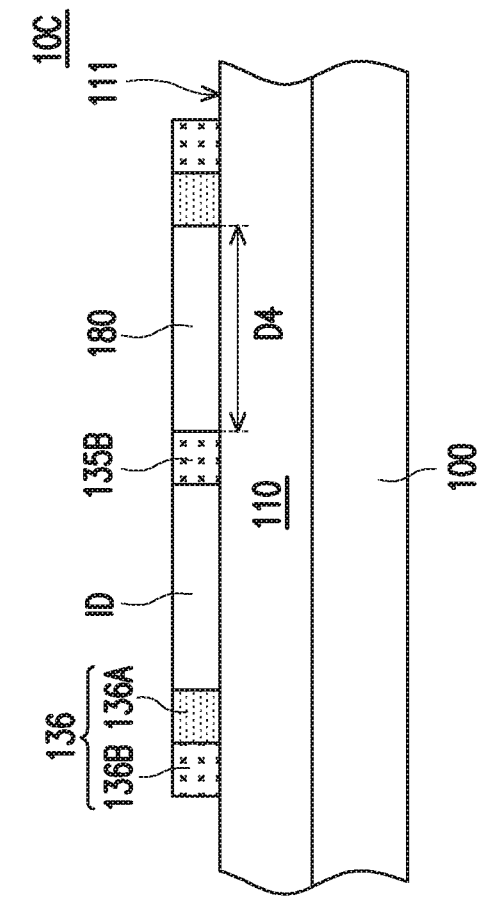
FIG. 12B and FIG. 12C are schematic cross-sectional views of the structure of FIG. 12A along the cross-section lines I-I and II-II respectively according to some exemplary embodiments of the disclosure.
Figure 12B:
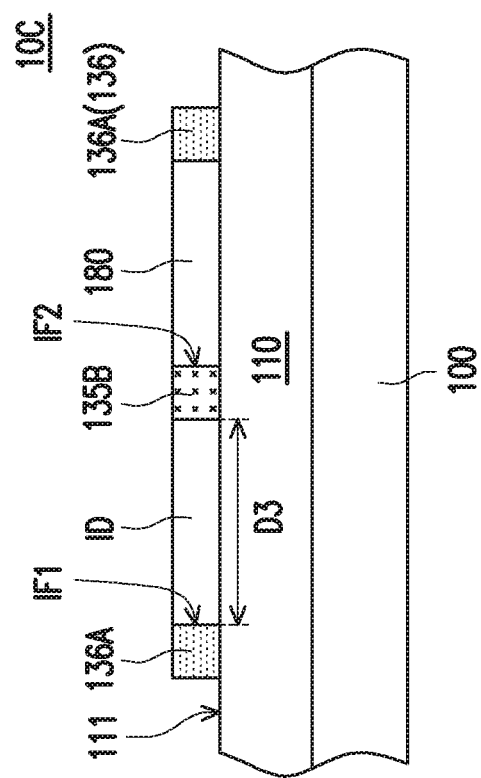

FIG. 12A is a schematic perspective view showing a portion of the structure including a capacitor structure in accordance with some embodiments of the disclosure. The structure of FIG. 12A may be fabricated following the process steps depicted in FIG. 1 to FIG. 3, FIG. 5 and FIG. 7. FIG. 12B and FIG. 12C are schematic cross-sectional views of the structure of FIG. 12A along the cross-section lines I-I and II-II respectively according to some exemplary embodiments of the disclosure. That is, neither the spacer nor the silicide layer(s) is present in FIG. 12A through FIG. 12C for illustration purposes.

Then, as shown in FIG. 7, in some embodiments, a plurality of contacts 190 is formed in the ILD layer 180. In some embodiments, the contacts 190 are connected to the silicide top layers 170 on the doped semiconductor material pattern 134, the S/D regions 160 and on the heavily doped portions 135B and 136B, respectively. In some embodiments, the formation of the contacts 190 includes forming a patterned mask layer (not shown) over the ILD layer and dry etching the ILD layer using the patterned mask layer as a mask to form openings exposing the silicide top layers 170. In certain embodiments, the ILD layer 180 may further include an etch stop layer (not shown) therein. Thereafter, a conductive material is deposited and filled into the contact openings to form the contacts 190. The conductive material is a metal layer including aluminum, copper, tungsten, or alloys thereof, and the conductive material may be formed by performing a CVD process, for example.

In alternative embodiments, the ILD layer 180 formed in the isolating region may further include an optional insulator material (not shown) filled between the portions 135B, 136A and 136B in the isolating region IR. The formation of the insulator material includes sequentially depositing a silicon oxide layer, a silicon nitride layer and a silicon oxide layer covering and filling between the portions 135B, 136A and 136B in the isolating region IR.

In some embodiments, as shown in the left and middle portions of FIG. 7, the ILD layer 180 fills up the gaps/spaces G between the portions 135B, 136A and 136B in the isolating region IR. As shown in FIG. 7 & FIG. 12A, the portions 135B, 136A and 136B located on the isolation structure(s) 110 and the ILD layer 180 filled between the portions 135B, 136A and 136B constitute a capacitor structure 10C. In FIG. 12A, the ILD layer 180 fills between the heavily doped portion 135B and the ring-shaped structure that includes the lightly doped portions 136A and heavily doped portions 136B. As shown in FIG. 12A through FIG. 12C, the capacitor structure 10C is a horizontal structure overlying on the top surface 111 (as the horizontal plane) of the isolation structure 110. In certain embodiments, when the semiconductor material is polysilicon, the capacitor structure 10C includes the portions 135B, 136A and 136B as the polysilicon parts and the ILD layer 180 filled between the portions 135B, 136A and 136B as the insulator part (ID) of a polysilicon-insulator-polysilicon (PIP) capacitor structure arranged along the horizontal plane. In some embodiments, the interface IF1 between the lightly doped portion 136A and the insulator part ID (the ILD layer 180) is substantially perpendicular to the horizontal plane of the top surface 111 of the isolation structure 110. In some embodiments, the interface IF2 between the heavily doped portion 135B and the insulator part ID (the ILD layer 180) is substantially perpendicular to the horizontal plane of the top surface 111 of the isolation structure 110. If considering the portions 135B, 136B and 136A packed with the insulator portion ID are arranged at the same level (same horizontal level) and directly on the isolation structure 110, such configuration of the capacitor structure 10C is very different from the vertically stacked three layered capacitor structure. That is, the capacitor structure 10C may be considered as a horizontal-type capacitor.

Referring to FIG. 12B and FIG. 12C, the heavily doped portion 135B, the lightly doped portion 136A and the insulating ILD layer 180 sandwiched there-between may function as the gate, the bulk (lightly doped body) and the insulator of a polysilicon insulator polysilicon (PIP) capacitor. The doping characteristics of the PIP capacitor electrode plates lead to capacitance variations, with changes in the capacitance as a function of applied voltage. When the dopant types (or dopant concentrations) of the electrode plates, i.e., the heavily doped portion 135B and the lightly doped portion 136A, are different, the PIP capacitor is a variable capacitor. The capacitance of the PIP capacitor increases with the voltage applied to the gate. In one embodiment, when the heavily doped portions 135B and 136B are N-type heavily doped portions, and the lightly doped portion 136A is an N-type lightly doped portion, the capacitor is a variable capacitor. In one embodiment, when the heavily doped portion 135B is an N-type heavily doped portion, the heavily doped portions 136B are P-type heavily doped portions, and the lightly doped portion 136A is a P-type lightly doped portion, the capacitor is a variable capacitor. In one embodiment, when the heavily doped portion 135B is a P-type heavily doped portion, the heavily doped portions 136B are N-type heavily doped portions, and the lightly doped portion 136A is an N-type lightly doped portion, the capacitor is a variable capacitor. In one embodiment, when the heavily doped portions 135B and 136B are P-type heavily doped portions, and the lightly doped portion 136A is a P-type lightly doped portion, the capacitor is a variable capacitor.

Following the previous processes according to some embodiments, the semiconductor material layer or the polysilicon layer used for forming the gate electrode for MOS transistors is also used to form the heavily doped portion 135B, the lightly doped portion 136A, which are functioned as upper and lower electrodes of a PIP capacitor. In some embodiments, portions of the semiconductor material layer or the polysilicon layer served as the upper electrode may be doped with source/drain implants, while other portions of the semiconductor material layer or the polysilicon layer served as the lower electrode may be doped with LDD implants.

As shown in FIG. 12B and FIG. 12C, the lightly doped portion 136A is spaced apart from the heavily doped portion 135B with a distance D3 in the X axis direction and with a distance D4 in the Y-axis direction. As the insulating ILD layer 180 is filled between the space between the portions 135B and 136A, the ILD layer 180 filled between the portions 135B and 136A is formed with a thickness in the X axis direction equivalent to D3 and a thickness in the Y-axis direction equivalent to D4. Since the capacitor structure 10C is a horizontal-type capacitor, the thickness of the insulator can be easily tuned by modifying the distance between the heavily doped portion 135B and the lightly doped portion 136A. Therefore, based on the product requirements, the capacitance of the capacitor structure can be designed or tuned through the modification of the layout or configuration of the semiconductor material patterns during the MOS manufacturing processes. In this case, there is no need to use additional mask(s) and perform additional processes to specifically form the gate oxide of different thicknesses, especially thicker gate oxide, for the formation of the capacitor structure. Also, the insulator or dielectric integrity of the horizontal-type capacitor is improved as the localized thinning of the insulator is reduced. Accordingly, the horizontal-type capacitor structure may be formed without the need of forming an addition polysilicon layer and/or performing extra implantation processes. The formation of the capacitor structure is compatible with the CMOS manufacturing processes and is more cost-effective. Further, the capacitor structure is formed in the non-active region or the isolating region and is located on the isolation structure(s), more layout area is saved for forming active components.

Figure 13:
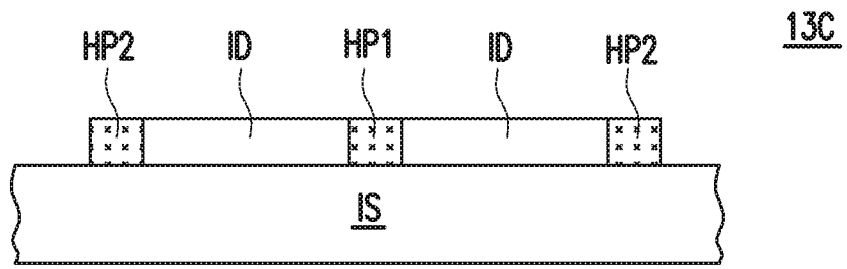
FIG. 13 is a schematic cross-sectional view showing a capacitor structure in accordance with some embodiments of the disclosure.

In another embodiments, as shown in FIG. 13, the capacitor structure 13C is located on the isolation structure IS and has a ring-shaped heavily doped portion HP2 and a heavily doped portion HP1 located in the middle of and spaced apart from the heavily doped portion HP2. Also, the capacitor structure 13C has an insulator portion ID sandwiched and located between the heavily doped portions HP1 and HP2. The ring-shaped heavily doped portion HP2 functions similarly to the heavily doped portion 136B shown in FIG. 12A. The heavily doped portion HP1 functions similarly to the heavily doped portion 135B shown in FIG. 12A. Different from the structure of FIG. 12A, the capacitor structure of FIG. 13 has no lightly doping portion. When the heavily doped portions HP1 and HP2 are of the same conductive type and have the same doping concentration, the capacitor structure 13C serves as a constant capacitor.

Figure 14:
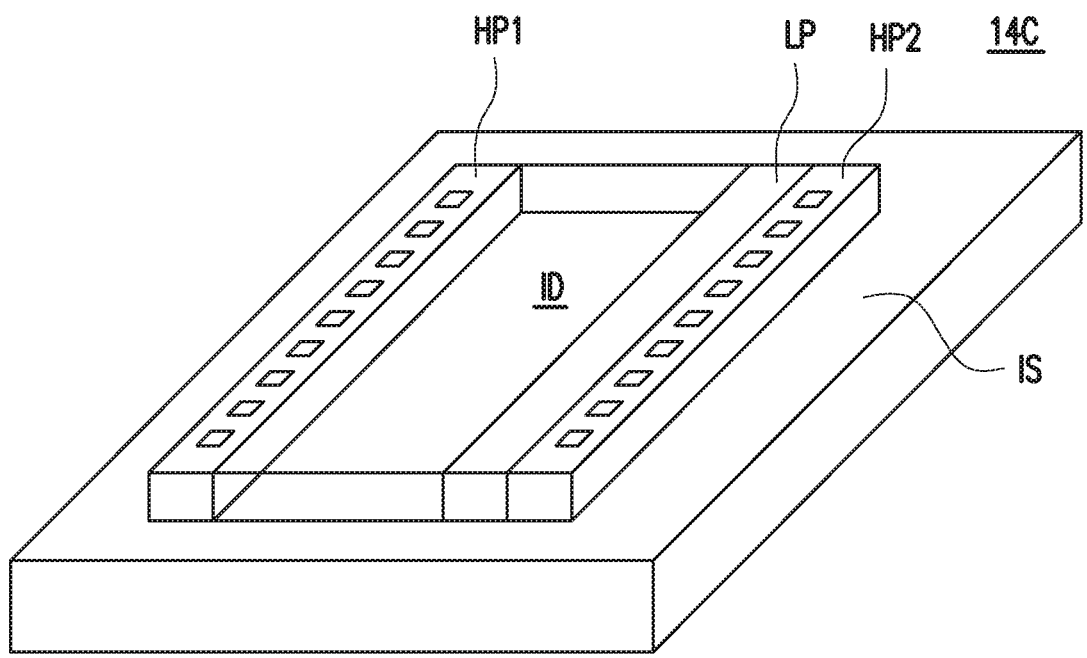
FIG. 14 is a schematic prospective view showing a portion of the structure including a capacitor structure in accordance with some embodiments of the disclosure.

FIG. 14 is a schematic prospective view showing a portion of the structure including a capacitor structure in accordance with some embodiments of the disclosure. Referring to FIG. 14, in some embodiments, the capacitor structure 14C is a horizontal type capacitor and is located on the isolation structure IS. In some embodiments, the structure 14C includes a first heavily doped portion HP1 and a second heavily doped portion HP2. The first and second heavily doped portions are shaped as strip structures and arranged in parallel. In some embodiments, the structure 14C includes a lightly doped portion LP located next to the second heavily doped portion HP2 and located between the first and second heavily doped portions HP1 and HP2. Also, the capacitor structure 14C has an insulator portion ID sandwiched between the lightly doped portion LP and the first heavily doped portion HP1 and located between the heavily doped portions HP1 and HP2. The first heavily doped portion HP1 and the second heavily doped portion HP2 function similarly to the heavily doped portion 135B, 136B shown in FIG. 12A. The lightly doped portion LP functions similarly to the lightly doped portion 136A shown in FIG. 12A. Thus, the capacitor structure 14C functions as a MOS capacitor, and has a variable capacitance in response to a varied bias.

Following the previous processes according to some embodiments, the lightly and heavily doped portions of the capacitor structure 14C may be formed from the semiconductor material layer or the polysilicon layer used for forming the gate electrode for MOS transistors. In some embodiments, the heavily doped portions HP1 and HP2 may be doped with source/drain implants, while the lightly doped portion may be doped with LDD implant.

Figure 15:
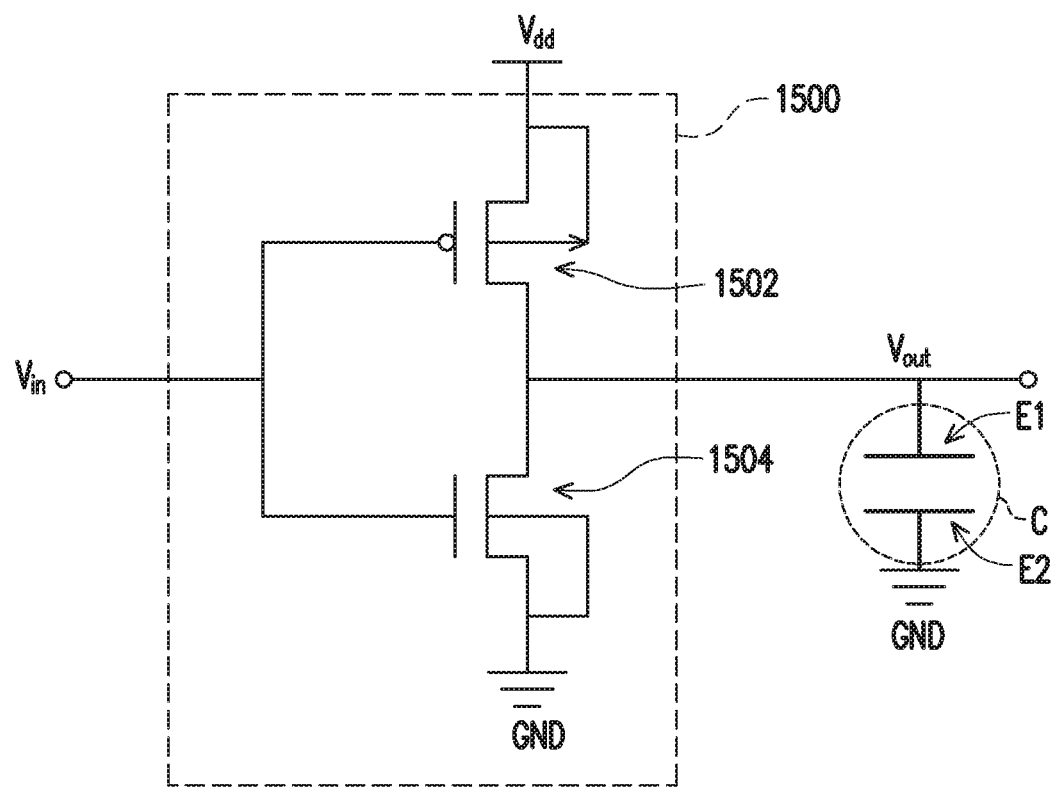
FIG. 15 is a circuit diagram showing an inverter connected with a capacitor.

FIG. 15 is a circuit diagram showing an inverter 1500 connected with a capacitor C. In one exemplary embodiment, the inverter 1500 includes a P-type MOS (PMOS) transistor 1502 and an N-type MOS (NMOS) transistor 1504. In FIG. 15, the PMOS transistor 1502 is electrically connected to power or high voltage supply HV $V_{dd}$, while the NMOS transistor 1504 is electrically connected to the ground GND. The capacitor C is connected with the output terminal and also connected to the ground GND. In some embodiments, the capacitor C is a constant capacitor and is electrically connected with the inverter 1500. In certain embodiments, the capacitor C includes or is formed of the capacitor structure(s) as described in the above contexts. In one embodiment, the capacitor C has upper and lower electrodes E1 and E2, which are similar to the heavily doped portions HP1 and HP2 of the capacitor structure 13C shown in FIG. 13. In one embodiment, the capacitor C has upper and lower electrodes E1 and E2, which are similar to the heavily doped portion 135B and the lightly doped portion 136A of the capacitor structure 10C shown in FIG. 12A. As described herein, the possible applications of the capacitor structures are not limited by the embodiments provided herein, and the capacitor structures may be applicable for any circuitry or used in combination with different electronic devices.

In accordance with some embodiments, a semiconductor device includes an isolation structure and a capacitor structure located on a top surface of the isolation structure. The capacitor structure includes a semiconductor material pattern and an insulator pattern inlaid in the semiconductor pattern. The semiconductor material pattern and the insulator pattern are located at a same horizontal level on the isolation structure.

In accordance with some embodiments, a semiconductor device includes an isolation structure and a capacitor structure located on a top surface of the isolation structure. The capacitor structure includes a semiconductor material pattern and an insulator pattern filled in the semiconductor pattern. The semiconductor material pattern and the insulator pattern are in contact with the top surface of the isolation structure, and an interface of the semiconductor material pattern and the insulator pattern is substantially perpendicular to the top surface of the isolation structure.

In accordance with some embodiments, a method of manufacturing a semiconductor device includes at least the following steps. An isolation structure is formed in a substrate to define an isolating region. A semiconductor material pattern is formed on the isolation structure. A lightly doped portion is formed with a first doping concentration in the semiconductor material pattern by performing a first ion implantation process to the semiconductor material pattern in the isolating region. At least one heavily doped portion is formed in the semiconductor material pattern by performing a second ion implantation process to the semiconductor material pattern in the isolating region. The at least one heavily doped portion has a doping concentration higher than the first doping concentration. An insulator material layer is formed over the substrate covering the semiconductor material pattern in the isolating region. The insulator material layer at least fills up a gap of the semiconductor material pattern to form a capacitor.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a substrate having isolation structures therein; and
a capacitor structure located on a top surface of the isolation structure, wherein the capacitor structure comprises a semiconductor material pattern and an insulator pattern inlaid in the semiconductor material pattern, wherein the semiconductor material pattern and the insulator pattern are located at a same horizontal level on the isolation structures;
wherein the semiconductor material pattern comprises a lightly doped portion and a first heavily doped portion sandwiching the insulator pattern, and wherein the lightly doped portion has a doping concentration lower than that of the first heavily doped portion.

2. The semiconductor device of claim 1, wherein the semiconductor material pattern further comprises a second heavily doped portion, contacting the lightly doped portion on opposite sides of the insulator pattern.

3. The semiconductor device of claim 2, wherein the first and second heavily doped portions have a same doping concentration.

4. The semiconductor device of claim 3, wherein the second heavily doped portion is a strip structure covering one sidewall surface of the lightly doped portion.

5. The semiconductor device of claim 4, wherein the first and second heavily doped portions and the lightly doped portion are strip structures arranged in parallel, the insulator pattern is in contact with the first heavily doped portion and the lightly doped portion, and the lightly doped portion is in contact with the second heavily doped portion and the insulator pattern.

6. The semiconductor device of claim 2, wherein the lightly doped portion has a doping concentration lower than that of the first and second heavily doped portions.

7. The semiconductor device of claim 6, wherein the lightly doped portion includes a ring structure, the first heavily doped portion is located within the ring structure and is isolated from the lightly doped portion by the insulator pattern, and the second heavily doped portion comprises strip structures arranged at opposite sides the lightly doped portion and are in contact with the lightly doped portion.

8. A semiconductor device, comprising:
a substrate having isolation structures therein; and
a capacitor structure located on a top surface of the isolation structure, wherein the capacitor structure comprises an insulator pattern with a ring shape and a semiconductor material pattern having a first heavily doped portion inside the insulator pattern and a second ring-shaped portion enclosing the insulator pattern, wherein the semiconductor material pattern and the insulator pattern are in contact with the top surface of the isolation structure.

9. The semiconductor device of claim 8, wherein the second ring-shaped portion comprises a second heavily doped portion disposed on opposite sides of the insulator pattern.

10. The semiconductor device of claim 9, wherein the first and second heavily doped portions are of a same conductive type and have a same doping concentration.

11. The semiconductor device of claim 9, wherein the second ring-shaped portion further comprises a lightly doped portion located between the insulator pattern and the second heavily doped portion, wherein the insulator pattern is sandwiched between the first heavily doped portion and the lightly doped portion, and the lightly doped portion has a doping concentration lower than that of the first and second heavily doped portions.

12. The semiconductor device of claim 11, wherein the first heavily doped portion is of a conductive type different from that of the lightly doped portion and the second heavily doped portion.

13. The semiconductor device of claim 11, wherein the first and second heavily doped portions are strip structures arranged in parallel.

14. The semiconductor device of claim 11, wherein the lightly doped portion has a ring shape.

15. The semiconductor device of claim 14, wherein the second heavily doped portion comprises strip structures covering opposite sides of the lightly doped portion.

16. The semiconductor device of claim 15, wherein the second heavily doped portion is in contact with the lightly doped portion.

17. A semiconductor device, comprising:
- an isolation structure disposed in a substrate;
- a lightly doped semiconductor ring with a first doping concentration disposed on the isolation structure;
- a heavily doped semiconductor structure disposed in a center region of the lightly doped semiconductor ring and on the isolation structure, the heavily doped semiconductor structure has a second doping concentration higher than the first doping concentration; and
- an insulator material layer filling spaces between the lightly doped semiconductor ring and the heavily doped semiconductor structure.

18. The semiconductor device of claim 17, further comprising a transistor disposed in an active region of the substrate, wherein the transistor has a lightly doped semiconductor region with the first doping concentration.

19. The semiconductor device of claim 18, wherein the transistor has source and drain regions with the first doping concentration.

20. The semiconductor device of claim 17, wherein the insulator material layer extends upwardly and covers top surfaces of the lightly doped semiconductor ring and the heavily doped semiconductor structure.

* * * * *